United States Patent [19]

White et al.

[11] Patent Number: 5,012,474
[45] Date of Patent: Apr. 30, 1991

[54] POLARIZATION SWITCHING IN ACTIVE DEVICES

[75] Inventors: Ian H. White, Cambridge; Richard S. Linton, Chester, both of England

[73] Assignee: British Telecommunications public limited company, London, England

[21] Appl. No.: 424,232

[22] PCT Filed: Mar. 9, 1989

[86] PCT No.: PCT/GB89/00236
§ 371 Date: Oct. 16, 1989
§ 102(e) Date: Oct. 16, 1989

[87] PCT Pub. No.: WO89/08937
PCT Pub. Date: Sep. 21, 1989

[30] Foreign Application Priority Data

Mar. 9, 1988 [GB] United Kingdom ............... 8805620

[51] Int. Cl.$^5$ .............................................. H01S 3/103
[52] U.S. Cl. ............................................ 372/27; 372/8; 372/46; 372/50
[58] Field of Search ................... 372/8, 50, 45, 46, 26, 372/27

[56] References Cited

U.S. PATENT DOCUMENTS

| | | | |
|---|---|---|---|
| 4,612,645 | 9/1986 | Liu et al. | 372/45 |
| 4,685,108 | 8/1987 | Seymour et al. | 372/19 |
| 4,689,793 | 8/1987 | Liu et al. | 372/8 |
| 4,809,290 | 2/1989 | White et al. | 372/44 |
| 4,922,497 | 5/1990 | Mori et al. | 372/8 |

FOREIGN PATENT DOCUMENTS 0147808 7/1985 European Pat. Off. .
WO89/08937 9/1989 PCT Int'l Appl. .

OTHER PUBLICATIONS

*Applied Optics*, vol. 23, No. 9, May 1, 1984, Shore, "Radiation Patterns for Optically Steered Semiconductor Steered Semiconductor, etc.", pp. 1386-1390.
*Applied Physics Letters*, vol. 42, No. 8, Apr. 15, 1983, Tsang et al., "High Speed Direct Single-Frequency Modulation, etc.", pp. 650-652.
*Applied Physics Letters*, vol. 44, No. 4, Feb. 15, 1984, Olsson et al., "Spectral Bistability in Coupled Cavity Semiconductor Lasers", pp. 375-377.
*Applied Physics Letters*, vol. 45, No. 6, Sep. 15, 1984, Chen et al., "Direct Polarization Switching in Semiconductor Lasers", pp. 604-606.
*Applied Physics Letters*, vol. 46, No. 1, Jan. 1, 1985, Chen et al., "Polarization Bistability in Semiconductor Lasers", pp. 16-18.
*Applied Physics Letters*, vol. 50, No. 2, Jan. 12, 1987, Sapia et al., "Polarization Switching in Semiconductor Lasers, etc.", pp. 57-59.
*Applied Physics Letters*, vol. 50, No. 8, Feb. 23, 1987, Watanabe et al., "Optical Tristability Using a Twin-Stripe Laser Diode", pp. 427-429.
*Applied Physics Letters*, vol. 50, No. 6, Apr. 20, 1987, Amann, "Polarization Control in Ridge-Waveguide-Laser Diodes", pp. 1038-1040.
*Applied Physics Letters*, vol. 51, No. 24, Dec. 14, 1987, Mori et al., "Optical Polarization Bistability with High Switching, etc.", pp. 1971-1973.
*Electronics Letters*, vol. 19, No. 9, Apr. 28, 1983, White et al., "New Mechanism for Bistable Operation of Closely Coupled, etc.", pp. 337-339.
*Electronics Letters*, vol. 19, No. 14, Jul. 7, 1983, White et al., "Room-Temperature Optically Triggered Bistability, etc.", pp. 558-560.

(List continued on next page.)

*Primary Examiner*—Frank Gonzalez
*Assistant Examiner*—Galen J. Hansen
*Attorney, Agent, or Firm*—Nixon & Vanderhye

[57] ABSTRACT

The output polarization of a twin guide semiconductor laser is switched either by controlling the operating current of both guides or by injecting an optical signal. Twin-stripe and twin-ridge lasers of InGaAsP are described. True polarization bistability is reported for a range of devices: the effect is temperature insensitive.

46 Claims, 4 Drawing Sheets

OTHER PUBLICATIONS

*Electronics Letters*, vol. 24, No. 19, Sep. 15, 1988, Linton et al., "Optically Triggered Polarization Bistability in GaInAsP, etc.", pp. 1232–1234.

*IEEE Journal of Quantum Electronics*, vol. QE-18, No. 9, Sep. 1982, Harder et al., "Bistability and Pulsations in, etc.", pp. 1351–1361.

*IEEE Journal of Quantum Electronics*, vol. QE-19, No. 11, Nov. 1983, Tsang et al., "Optoelectric Logic Operations by, etc.", pp. 1621–1625.

*IEEE Journal of Quantum Electronics*, vol. QE-21, No. 4, Apr. 1985, Liu et al., "Digital Optical Signal Processing with, etc.", pp. 298–306.

*IEE Proceedings*, vol. 131, Pt. H, No. 5, Oct. 1984, White et al., "Optical Bistability in Twin-Stripe Lasers", pp. 309–321.

*Optical and Quantum Electronics*, 14 (1982), Shore, "Optically Induced Spatial Instability in Twin-Stripe-Geometry Lasers", pp. 177–181.

Fig. 4(a) TM LIGHT OUTPUT

Fig. 4(b) TE LIGHT OUTPUT (RELATIVE UNITS)

Fig. 4(c) CURRENT (mA)

Fig. 5(a)

Fig. 5(b) TE LIGHT

Fig. 5(c) TM LIGHT

Fig. 5(d) TOTAL LIGHT (HALF SIZE)

POLARIZATION SWITCHING IN ACTIVE DEVICES

The present invention relates to the controlled switching of the polarisation states in the optical output of a semiconductor optical device.

The radiation used in optical communications is not necessarily in the visible part of the electromagnetic spectrum and the words "optical" and "light" when used in this specification are not to be interpreted as implying any such limitation. For example, longer wavelengths are preferred for transmission through silica optical fibres because the loss minima occur in such fibres in the infra-red region, at 1.3μm and 1.55μm approximately.

Electronically controlled polarisation modulators or switches are important components for high-speed optical communications and data transmission systems. Currently bulk and waveguide polarisation switches based on the use of the electro-optic effect are the most commonly used passive devices.

Polarisation bistability in semiconductor lasers shows promise for use in all-optical signal processing systems, in routing systems and in optical computing and has aroused much interest. Polarisation bistability arises from the ability or certain types of diode lasers to emit light with either its transverse electric field polarised parallel to the junction plane (TE) or with its transverse magnetic field polarised parallel to the junction plane (TM), depending on relative mode losses determined by the device structure. In most semiconductor diode lasers, the TE mode sees a higher reflectivity at the facets than the TM mode, resulting in predominantly TE polarised light output. However, polarisation switching has been achieved by varying the relative TE-TM mode cavity losses, for example by generating stress inside the active region through the application of external pressure. Y C Chen and J M Liu have reported (Applied Physics Letters, Volume 45, Number 6, 15 Sept. 1984, Pages 604 to 606) polarisation switching in InGaAsP/InP buried heterostructure lasers operating near their polarisation transition temperature of −68° C. Chen an Liu report that polarisation switching of the laser output is achieved by a relative change in the net gain of the TM and TE modes through a small perturbation (of the order of 1° C.) of the junction temperature induced by the injection current. Although Chen and Liu suggest that with sufficient internal strain in the device's active layer the polarisation transition occurs at room temperature, and indicate that for InGaAsP/InP lasers the strain can be created easily by introducing a small amount (of the order of $10^{31\ 4}$) of the lattice mismatch between the InGaAsP active layer and the InP cladding layers and InP substrate, neither they nor anyone else appear to have been able to achieve such current driven polarisation switching at room temperature.

Polarisation switching has also been induced by the injection of TM polarised light from a master laser into a TE-emitting slave laser causing the latter to switch to a TM-emitting state, but switch-back and locking of the TE mode have not been observed (A Sapia, P Spano. and B Daino, Applied Physics Letters, Vol 50, No 2, 12 Jan. 1987, pages 57-59).

Mori, Shibtat and Kajiwara of Matsushita have reported (extended abstracts of 18th, 1986, International conference on solid state devices and materials, Tokyo, pp 723-724) what appears to be polarisation bistability controlled by applied current in an InGaAsP buried heterostructure laser simultaneously injected with a 0.7 mW TM wave from a similar laser.

To date, despite their tremendous commercial importance neither optically triggered bistable switching nor room temperature direct polarisation switching have been reported.

According to a first aspect, the present invention provides a bistable polarisation source comprising a semiconductor injection laser capable of providing optical gain in two distinguishable waveguiding paths, the waveguiding paths extending substantially parallel to one another at a small enough separation to enable the fields of optical radiation in the two paths to overlap, the laser being switchable between first and second states in which the direct optical output of the laser is predominantly TE polarised and predominantly TM polarised respectively.

According to a second aspect the present invention. provides an optical logic element comprising a semiconductor injection laser capable of providing optical gain in two distinguishable waveguiding paths, the waveguiding paths extending substantially parallel to one another at a small enough separation to enable the fields of optical radiation in the two paths to overlap, the laser being switchable between first and second states in which the direct optical output of the laser is predominantly TE polarised and predominantly TM polarised respectively.

Preferred embodiments of the present invention will now be described, by way of example only, with reference to the accompanying drawings in which.

Although terms such as "above" and "uppermost" are used in this specification, they are used for convenience of description only and should not be taken to imply any necessary associated orientation unless the context indicates otherwise.

Figure 1:
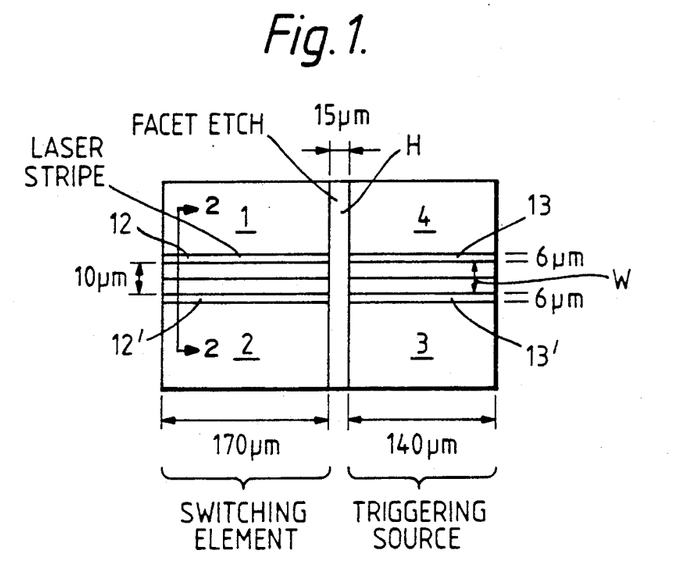
FIG. 1 shows a schematic plan view of a polarisation switching element and optical triggering element produced on a single chip.

Referring to FIG. 1, a twin stripe laser is facet etched to produce two twin stripe lasers 1 and 2 on a single chip. The 'parent' laser is a 1.3 μm InGaAsP double heterostructure laser groun on an InP substrate 11 using conventional liquid phase epitaxy.

The structure of the lasers is best described with reference to FIGS. 1 and 2. The InP substrate 11 is 100 -150 μm thick and metallised on its lowermost face 14. Onto the substrate 11 are grown, by conventional epitaxial growth techniques, four layers: a 1 μm layer 21 of n-doped InP; a 0.1 μm active layer 22 of InGaAsP lattice matched to InP; a 1.3 μm layer 15 of Zn doped InP; and a 0.2 μm capping layer 16 of InGaAs. Each of the doped layers is doped to a conventional level for use in semiconductor laser technology. The active layer 22 lies between two layers 21, 15 of higher band gap and lower refractive index material to give both optical and carrier confinement in a direction normal to the layers.

Onto the capping layer 16 is deposited a 1000 Å layer 17 of $Si_xN_y$. Two stripe windows 18, 19 are etched through the $Si_xN_y$ down to the level of the capping layer 16. A double metal layer of 3 μm of Au on 500 Angstroms of Ti is deposited on the dielectric layer 17 and into the stripe windows 18, 19 then etched to form the four contacts 12, $12^1$, 13, $13^1$ by forming the transverse and longitudinal gaps H and W. Although both the Ti and Au layers are etched to form the transverse gap H, only the Au layer is etched to form the longitudinal gap. Where the transverse gap H is formed the Au:Ti contact layer is removed by ion beam milling, the silicon nitride by dry etching with $CF_4$, and the semiconductor layers removed by reactive ion etching. Finally, the two current stripes are electrically isolated by etching, using a reactive ion beam, down to the bottom of the InGaAs cap layer 16. As the reactive ion etch is not selective, the etch step is stopped after a predetermined time calculated with a knowledge of the etch rate. A slight over etch, which removes part of the Zn doped layer, is acceptable. The overall length (the distance between the end facets) of the device shown in FIG. 1 is 325 μm, with a 15 μm wide facet etch displaced from the centre producing asymmetrical devices with two pairs of waveguides 170 μm and 140 μm long. The overall width of the device is 200 μm. The stripe windows are 6 μm wide, the inside edges of the stripes being separated by 10 μm.

The resistance measured between each pair of contacts in a direction across the width of the device is about 40 Ω while that measured in a direction along the device, traversing the transverse gap H, is greater than 200 K Ω. Operated one at a time, the four lasers exhibit similar performance. With the dimensions and construction given above, and with drive current pulses of 300 ns width, the individual lasers typically have threshold currents of around 140 mA above which TE polarised light was generated. If the drive current is further increased, the lasers begin to generate significant levels of TM light. The increase in TM mode intensity is accompanied by a rapid increase in the quantum efficiency of the lasing TE mode, and a subsequent decrease in the intensity of the TE mode.

Figure 3:
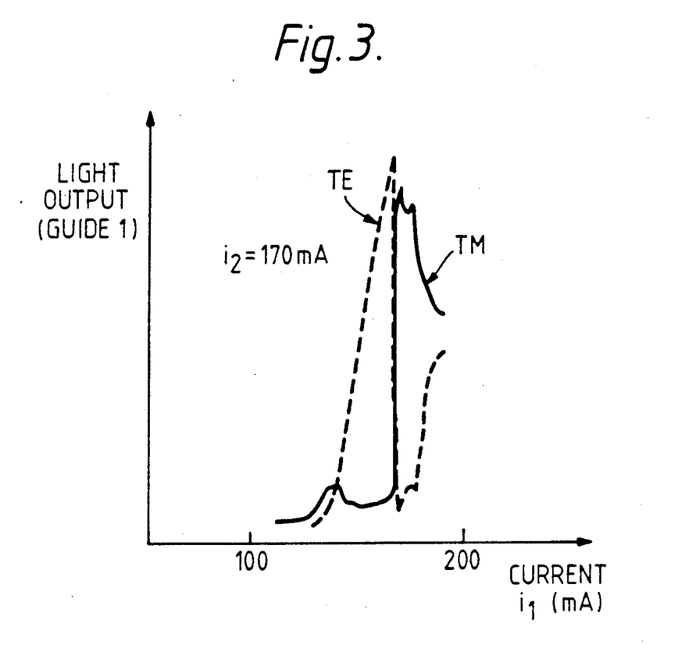
FIG. 3 shows a plot of light output against drive current for each of Guides 1 and 2 driven simultaneously.

When a pair of guides at one end of the device, for example guides 1 and 2, are driven together with currents above the threshold value of each individual laser guide, the other pair of guides not being energised, there is observed an abrupt, discontinuous decrease in the TE intensity and sudden appearance of the TM mode in both lasers. With equal drive levels of 170 mA to each of Guides 1 and 2, strong polarisation switching is found as shown in FIG. 3. Here, a large and sharp decrease in the intensity of one mode coincides with a similar increase in the orthogonal mode. This switching occurs simultaneously in both guide outputs, in the same direction. It is possible, by adjusting each current, to achieve a virtual switch-off of the higher intensity (lasing) mode with rejection ratios of the order of 20:1. The switch can also be triggered in both directions by superimposing brief, low amplitude current pulses onto one of the drive currents. With the 300 ns drive currents used, reliable switching could be achieved by superimposing alternating positive and negative 10 ns, 5 mA current pulses onto one of the drive currents. The operation was independent of the adjacent device.

Figure 2:
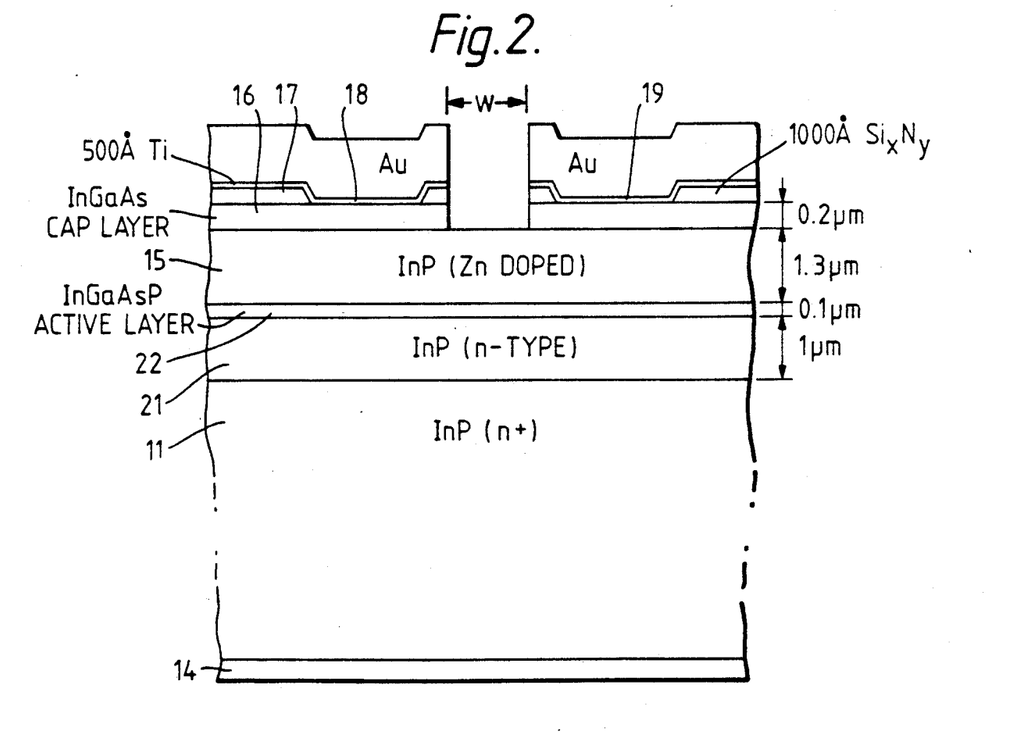
FIG. 2 shows a schematic cross section through a semiconductor injection laser for use in the present invention.

With the configuration shown in FIGS. 1 and 2 it is also possible to switch the output of guides 1 and 2 optically by utilising the pair of guides 3 and 4, at the opposite end of the device. With the Guides 1 and 2 energised with individual drive currents of 170 mA, a short, 40 ns, threshold current pulse applied to one of guides 3 and 4 switched the output of the guides 1 and 2 in one direction. 100 ns later a second similar current pulse applied to the other guide (4 or 3) switched the outputs of Lasers 1 and 2 back to the original state, as shown in FIGS. 4a-4c.

Figure 4A:
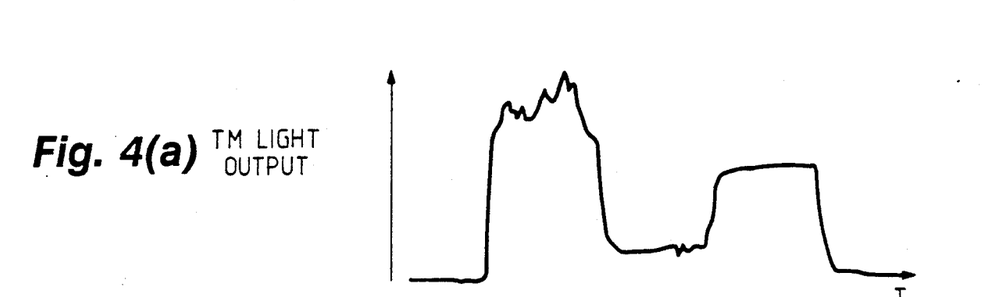
FIGS. 4a-4c show plots of the relationship between the triggering pulses applied to contacts 3 and 4 respectively and the output of TE and TM polarised light from the other pair of guides.
Figure 4B:
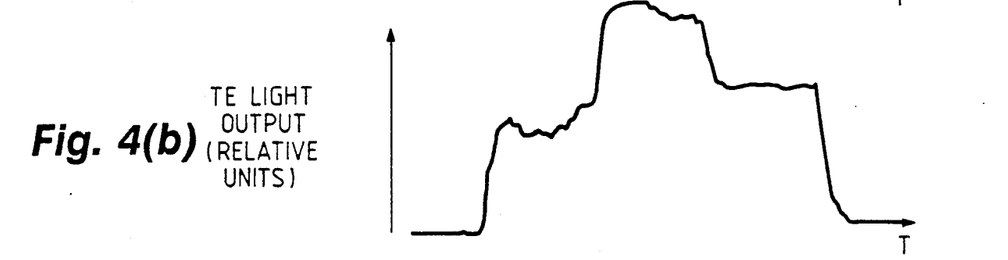
Figure 4C:
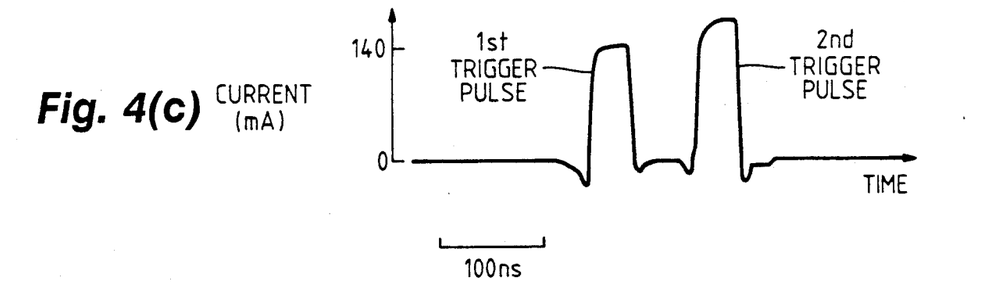
Figure 5A:
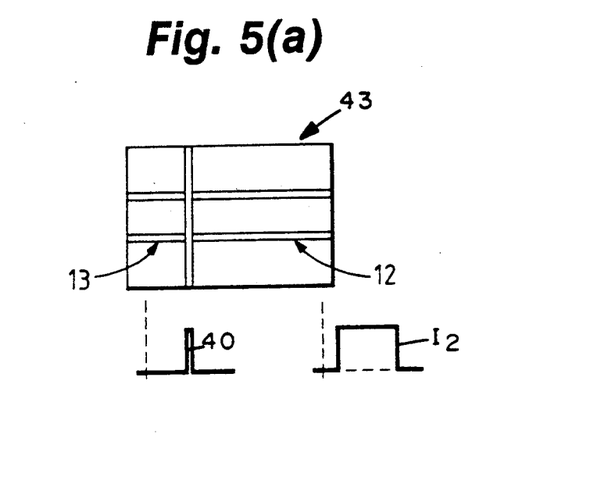
FIGS. 5a-5d show the inverting operation of a device according to the invention operated in a switching mode in which it is not bistable.
Figure 5B:
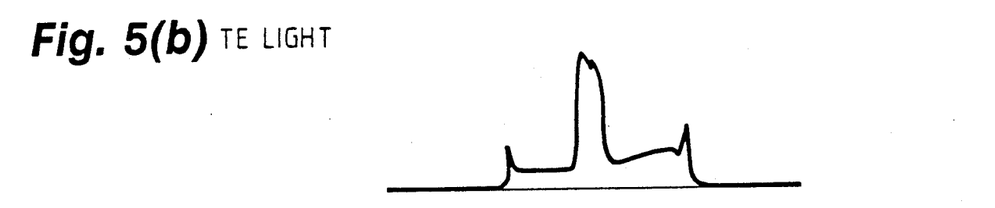
Figure 5C:
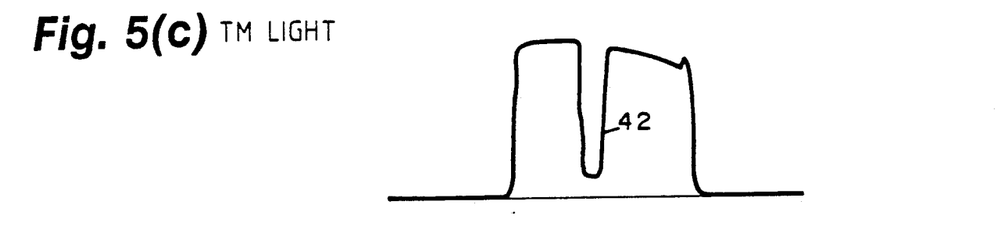
Figure 5D:
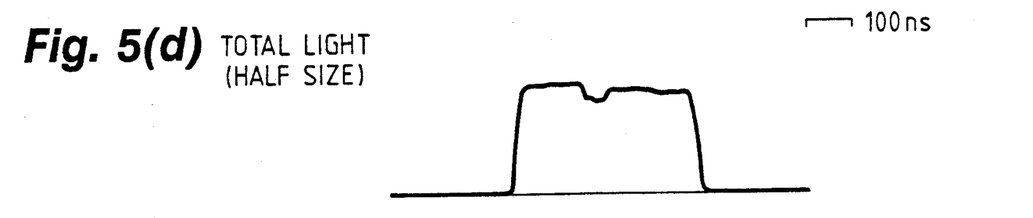

The difference in level of the two triggering pulses, shown in FIG. 4c, is due to the difference in threshold values of the two guides 3 and 4 in the sample on which FIGS. 4a-4c is based. With switching induced optically in this way rejection ratios of more than 15:1 have been obtained with a measured switching time of 100 ps, limited by the rise time of the avalanche photodiodes of the detection system. Such rapid switching makes the device attractive for use in fast optical switches. The combination of one of the devices and an optical polariser would enable very rapid on/off switching of laser light, at a rate much faster than it is conventionally possible to switch a semiconductor laser.

By using a device of the general type shown in FIG. 2, in combination with an appropriate polariser rapid on/off switching of a laser beam is effected using only very small control currents at low voltage. It is clearly an advantage of the present invention that switching can be achieved without the necessity to use the high voltages required by electro-optic modulators and pockel's cells.

Clearly, as those skilled in the art will understand, there is no necessity for the source of the optical triggering pulses (the triggering source) to be located on the same chip as the laser whose output polarisation is switched (the switching element). The optical triggering pulses could be carried to the switching element by an optical fibre or other optical waveguide. It is of course also not essential that the triggering source comprises lasers which are essentially identical to those of the switching element. Hence, although the wavelength of the triggering pulses should be within the gain spectrum of the switching element (which typically would be a few tens of nanometers), it is possible for the triggering source to comprise a laser of a configuration other than twin-stripe or twin-ridge and of materials other than InGaAsP alloys. The triggering source could also consist of a single laser, rather than what is effectively two, by providing some means to switch its output between the two guides of the swictching element. When using optical triggering pulses, the polarisation of the triggering pulse is that to which the appropriate waveguide output is to be switched.

When the device is used in the current-controlled switching mode, the triggering source, which is not activated, appears to make no contribution to the operation of the device. Consequently it appears that one half of the device shown in FIG. 2, that is either guides 1 and 2 or guides 3 and 4, could be produced separately and used as a current controlled polarisation switch. Such a device has the advantage that it is very small and provides controlled polarisation switching without the need for extra components such as gratings.

A large number of devices of various different dimensions and combinations of dimensions have been fabricated and assessed and have been found to give the desired rapid controlled switching of polarisation states.

This polarisation switching characteristic makes devices according to the invention useful in optical logic applications. Firstly, the devices can provide an inverting function by showing a low output when addressed by an external optical signal. This operation is shown in FIGS. 5a-5d, where a TE polarised optical input pulse 40 from a source produces a corresponding dip 42 in the TM output, FIG. 5c, of devive 43. Simultaneously, the TE output FIG. 5b, of device 43 shows the opposite reaction, a positive pulse corresponding to the TM "negative pulse". Overall, the total light output, FIG. 5d, of device 43 stays substantially constant in accordance with the profile of the current pulse $I_2$ applied to the relevant electrode of device 43. The current supplied to the two electrodes of the switching element is such, in this example, for the device to operate in a switchable mode rather than in a bistable mode. It is for this reason that the optical output switches back to TM after removal of the TE input pulse. For this mode of operation, the current applied to the electrode should be somewhere in the range where, were both electrodes to be driven, there is a rapid decrease in TE output, and a simultaneous increase in TM output, with increasing current (as previously described with reference to FIG. 3). In general, the requisite current for this type of operation will be somewhere within the range of 1.1 to 1.4 times threshold current, the actual operable range of any device generally being narrower than the just quoted range. For the device used to generate FIG. 3, a current of slightly less than 170 mA would be appropriate ($1.2 \times I_t$). It is, however, an easy matter to determine the appropriate electrode current, since the TE/TM transition is readily observed. Of course, if the switching element were initially to have a TE output, the input pulse would need to be TM polarised if the switching element's output polarisation were to be switched. This type of action could be used to provide an optical "NOT" gate.

Figure 6:
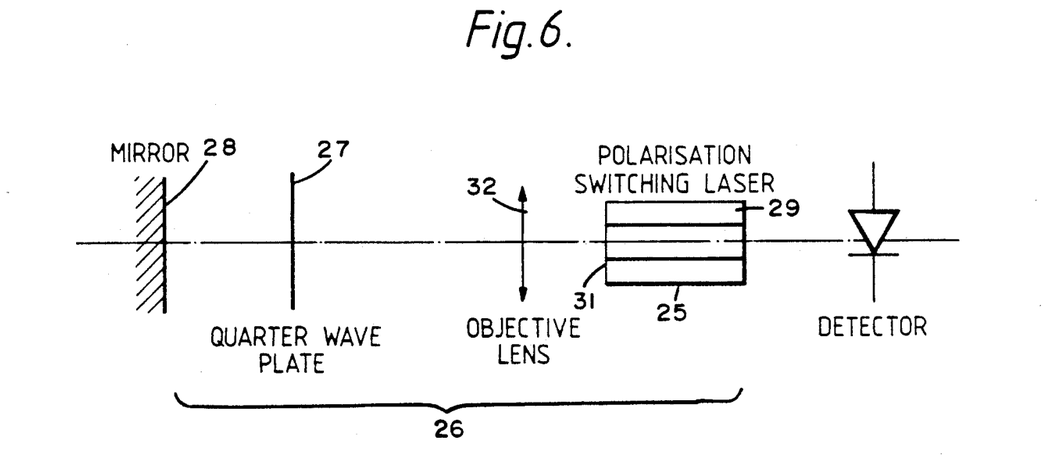
FIG. 6 shows schematically how a device according to the invention can be operated in an optical clock configuration.

Secondly, this inverting function can be used in an optical logic clock, as shown schematically in FIG. 6. Here the device 25 without the triggering source is placed in an external cavity 26 which incorporates a quarter wave plate 27 which enables light emitted with TE polarisation to be reinjected as TM and vice versa. The result is switching of the laser output between the orthogonal polarisations at the round trip period of the cavity. The external cavity 26 comprises a mirror 28 and a facet 29 of the device 25. Alternatively, a second distinct mirror (not shown) may effectively take the place of the facet as the cavity's second reflector. In either configuration, the near facet 31 of device 25 is preferably anti-reflection coated but this is not essential. In the first configuration the distant facet 29 (in this embodiment a cleaved facet) is not anti-reflection coated, and hence functions as a mirror, while in the second configuration it too is preferably anti-reflection coated. When mirror 28 is planar, an objective lens 32 is used between the near facet 31 and the mirror 28. As shown in FIG. 6 the objective lens is positioned between the quarter-wave plate 27 and the laser 25. With an external cavity length of about 30 cm we have achieved stable operation of a clock of this type over several hundred cycles. The device was operated in the bistable mode with both electrodes receiving similar currents.

In order to achieve the desirable effects that we have observed a sufficient level of coupling between the waveguides is required. Those skilled in the art will appreciate that the amount of coupling between two waveguides which are adjacent and substantially parallel one with the other is dependant on the product of the length of the waveguides and the coupling coefficient. As those skilled in the art will also be aware, the coupling coefficient is dependant on the width and separation of the waveguides, and on the index difference between each guide and its surroundings. While we believe that it may be possible to provide too much coupling, we have not yet managed to produce a structure which, as a result of too much coupling, fails to achieve the desirable effects we are seeking. The following ranges of dimensions, taken together with the other information contained within this specification . should enable those skilled in the art to produce devices according to the invention but using different materials, (e.g. GaAlAs-GaAs), dimensions and configurations.

We have found that the length of the switching device is important, as is the separation of the waveguides in that device. Stripe separation has been varied over a range from 5 $\mu$m to more than 20 $\mu$m. Above 20 $\mu$m separation, with the configuration and waveguide lengths that we are using, there tends to be sufficient coupling between the waveguides for sharp triggering to be achieved. If the length of the switching device waveguides is less than about 170 $\mu$m, rapid bistable switching between polarisation states is no longer achieved although the output polarisation state is still in fact switchable optically or by controlling the drive current. Switching is achieved within about 3 ns, this being limited by the carrier recombination time. Preferably the switching device has a cavity length or more than 170 $\mu$m, more preferably more than 190 $\mu$m.

Stripe width was varied in the range 5 to 6 $\mu$m but within this range was found to have no effect on the polarisation switching characteristic.

Devices of the type shown in FIG. 2 were also made with a range of different gap widths between the triggering element and the switching element. Gap widths ranged from 15 to 20 $\mu$m and within this range this variable was found to have no effect on the polarisation switching.

Given that the switching element is essentially based on the presence of a pair of suitably coupled waveguides it is worth looking at what other structures could be used to provide such an optical configuration.

Although the laser devices described above use standard stripe geometries, both gain and index guiding is involved in the device operation. Consequently it is not essential that simple stripe device structures be used. Suitable alternative waveguide structures include ridge or buried heterostructures as these can allow ready TE/TM operation. Clearly the tighter optical confinement provided in index guided structures means that in general the two guides, if there is to be sufficient coupling between them, will have to be closer together than the corresponding guides in gain guided structures such as those described above. Depending on the length of the cavities, and other factors, the wavelengths should preferably be no more about 15 $\mu$m apart, and more prefeably no more than about 10 $\mu$m apart. The minimum cavity length needed to achieve sufficient interaction and coupling is generally likely to be appreciable more than 150 μm and may be more than 200 μm.

We have found that with devices as described above the desirable effects are obtained without the need for any control device temperature. Not only is this a tremendous advantage, but it is also very unexpected, since others unsuccessfully looking to achieve controlled polarisation bistability have assumed that precise temperature control would be necessary.

We claim:

1. A bistable polarisation source comprising:
   a semiconductor injection laser providing optical gain in two waveguiding paths,
   the waveguiding paths extending substantially parallel to one another at a small enough separation to enable the fields of optical radiation in the two paths to overlap,
   the laser being switchable between first and second states in which the direct optical output of the laser is predominantly TE polarised and predominantly TM polarised respectively.

2. A polarisation source as in claim 1 wherein, in both said first and second states, the ratio of the dominant polarisation type to the subordinate polarisation type is greater than 10 to 1.

3. A polarisation source as in claim 1 wherein the ration is greater than 15 to 1.

4. A polarisation source as in claim 3 wherein the ratio is greater than 20 to 1.

5. A polarisation source as in claim 1 wherein switching between said states is effected by adjusting the operating current of the laser.

6. A polarisation source as in claim 1 wherein switching between said states is effected by injecting optical control signals.

7. A polarisation source as in claim 1 wherein said laser comprises a twin strip laser.

8. A polarisation source as in claim 7 wherein said laser has an active layer which is 150 μm or more in length.

9. A polarisation source as in claim 8 wherein said active layer is 170 μm or more in length.

10. A polarisation source as in claim 7 wherein the twin stripes are separated by a distance of between 5 and 20 μm.

11. A polarisation source as in claim 1 wherein the said laser comprises a twin ridge waveguide laser.

12. A polarisation source as in claim 11 wherein the ridge waveguides are separated by no more than 10 μm.

13. A polarisation source as in claim 11 wherein said laser has an active layer which is 170 μm or more in length.

14. An optical logic element comprising:
    a semiconductor injection laser providing optical gain in two waveguiding paths,
    the waveguiding paths extending substantially parallel to one another at a small enough separation to enable the fields of optical radiation in the two paths to overlap,
    the laser being switchable between first and second states in which the direct optical output of the laser is predominantly TE polarised and predominantly TM polarised respectively.

15. An optical clock arrangment for providing a regular stream of optical pulses comprising:
    laser means providing optical gain in two waveguiding paths,
    the waveguiding paths extending substantially parallel to one another at a small enough separation to enable the fields of optical radiation in the two paths to overlap,
    the laser means being switchable between first and second states in which the direct optical output of the laser is predominantly TE polarised and predominantly TM polarised respectively;
    feedback means providing an optical path by means of which an optical output from the laser means may be fed back into the laser means; and
    polarisation modifying means in said optical path providing a substantially orthogonal polarisation shift in said fed back optical output.

16. An optical clock arrangement as in claim 15 wherein said feedback means comprises essentially of a single mirror.

17. An optical clock arrangment as in claim 15 wherein said feedback means comprises a ring resonator.

18. An optical clock arrangment as in claim 17 wherein the ring resonator comprises a plurality of reflectors.

19. A bistable polarisation optical signal source comprising:
    a pair of semiconductor injection lasers having coupled optical lasing cavities switchable between a first state having a first polarisation optical output and a second state having a second polarisation optical output, said second polarisation being different than said first polarisation.

20. A bistable polarisation optical signal source as in claim 19 including means to effect switching between said first and second states by changing an electrical drive signal to at least one of said semiconductor injection lasers.

21. A bistable polarisation optical signal source as in claim 19 including means to effect switching between said first and second states by injecting an optical signal of predetermined polarisation into the lasing cavity of at least one of said semiconductor injection lasers.

22. An optical logic element comprising:
    a pair of semiconductor injection lasers having coupled optical lasing cavities switchable between a first state having a first polarisation optical output and a second state having a second polarisation optical output, said second polarisation being different than said first polarisation.

23. An optical clock for providing a regular stream of optical pulses of alternating polarisation, said clock comprising:
    a pair of lasers having coupled optical lasing cavities switchable between two different polarisation outputs; and an optical feedback path coupled to accept optical signals from both lasing cavities and to feedback such signals to the lasing cavities with a predetermined shift in polarisation.

24. A method for producing a bistable polarisation source comprising:
    operating a semiconductor injection laser to provide optical gain in two waveguiding paths, the waveguiding paths extending substantially parallel to one another at a small enough separation to enable the fields of optical radiation in the two paths to overlap, and
    switching the laser between first and second states in which the direct optical output of the laser is predominantly TE polarised and predominantly TM polarised respectively.

25. A method as in claim 24 wherein, in both said first and second states the ration of the dominant polarisation type to the subordinate polarisation type is greater than 10 to 1.

26. A method as in claim 24 wherein the ratio is greater than 15 to 1.

27. A method as in claim 26 wherein the ratio is greater than 20 to 1.

28. A method as in claim 24 wherein switching between said states is effected by adjusting the operating current of the laser.

29. A method as in claim 24 wherein switching between said states is effected by injecting optical control signals.

30. A method as in claim 24 wherein said laser comprises a twin stripe laser.

31. A method as in claim 30 wherein said laser has an active layer which is 150 μm or more in length.

32. A method as in claim 31 whrein said active layer is 170 μ, or more in length.

33. A method as in claim 30 wherein the twin stripes are separated by a distance of between 5 and 20 μm.

34. A method as in claim 24 wherein the said laser comprises a twin ridge waveguide laser.

35. A method as in claim 34 wherein the ridge waveguides are separated by no more than 10 μm.

36. A method as in claim 34 wherein said laser has an active layer which is 170 μm or more in length.

37. A method producing an optical logic element comprising:
   operating a semiconductor injection laser providing optical gain in two waveguiding paths, the waveguiding paths extending substantially parallel to one another at a small enough separation to enable the fields of optical radiation in the two paths to overlap, and
   switching the laser between first and second states in which the direct optical output of the laser is predominantly TE polarised and predominantly TM polarised respectively.

38. A method for producing an optical clock arrangement for providing a regular stream of optical pulses comprising:
   operating laser means to provide optical gain in two waveguiding paths, the waveguiding paths extending substantially parallel to one another at a small enough separation to enable the fields of optical radiation in the two paths to overlap,
   switching the laser means between first and second states in which the direct optical output of the laser is predominantly TE polarised and predominantly TN polarised respectively;
   feeding an optical output from the laser means may be fed back into the laser means; and
   providing a substantially orthogonal polarisation shift in said fed back optical output.

39. A method as in claim 38 wherein said feeding back step uses a single mirror.

40. A method as in claim 38 wherein said feeding back step uses a ring resonator.

41. A method as in claim 40 wherein the ring resonator uses a plurality of reflectors.

42. A method for producing bistable polarisation optical signal source comprising:
   switching a pair of semiconductor injection lasers having coupled optical lasing cavities between a first state having a first polarisation optical output and a second state having a second polarisation optical output, said second polarisation being different than said first polarisation.

43. A method as in claim 42 including switching between said first and second states by changing an electrical drive signal to at least one of said semiconductor injection lasers.

44. A method as in claim 42 including switching between said first and second states by injecting an optical signal of predetermined polarisation into the lasing cavity of at least one of said semiconductor injection lasers.

45. A method for producing an optical logic element comprising:
   switching a pair of semiconductor injection lasers having coupled optical lasing cavities between a first state having a first polarisation optical output and a second state having a second polarisation optical output, said second polarisation being different than said first polarisation.

46. A method for producing an optical clock for providing a regular stream of optical pulses of alternating polarisation, said method comprising:
   switching a pair of lasers having coupled optical lasing cavities between two different polarisation outputs; and
   feeding optical signals from both lasing cavities back to the lasing cavities with a predetermined shift in polarisation to effect said switching.

* * * * *

UNITED STATES PATENT AND TRADEMARK OFFICE
CERTIFICATE OF CORRECTION

PATENT NO. : 5,012,474
DATED : 30 April 1991
INVENTOR(S) : Ian H. WHITE It is certified that error appears in the above-identified patent and that said Letters Patent is hereby corrected as shown below:

Column 10, lines 7-8, delete "may be fed".

Signed and Sealed this

Fourteenth Day of September, 1993

Attest:

BRUCE LEHMAN

*Attesting Officer*   *Commissioner of Patents and Trademarks*